(12) United States Patent
Fernandez

(10) Patent No.: US 7,224,058 B2
(45) Date of Patent: May 29, 2007

(54) INTEGRATED CIRCUIT PACKAGE EMPLOYING A HEAT-SPREADER MEMBER

(75) Inventor: Elstan Anthony Fernandez, Singapore (SG)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/287,858

(22) Filed: Nov. 28, 2005

(65) Prior Publication Data

US 2006/0081980 A1    Apr. 20, 2006

Related U.S. Application Data

(63) Continuation of application No. PCT/SG2003/000126, filed on May 28, 2003.

(51) Int. Cl.
*H01L 23/34* (2006.01)
*H01L 21/00* (2006.01)
*H05K 7/20* (2006.01)

(52) U.S. Cl. .............. 257/707; 257/713; 257/720; 257/724; 257/784; 257/E23.051; 361/704; 361/709; 361/710; 438/122

(58) Field of Classification Search ............ None
See application file for complete search history.

(56) References Cited

U.S. PATENT DOCUMENTS

| | | | |
|---|---|---|---|
| 5,289,337 A | | 2/1994 | Aghazadeh et al. |
| 5,583,377 A | * | 12/1996 | Higgins, III ............ 257/707 |
| 5,646,828 A | * | 7/1997 | Degani et al. ........... 361/715 |
| 6,052,287 A | * | 4/2000 | Palmer et al. ........... 361/767 |
| 6,368,894 B1 | | 4/2002 | Shen |
| 6,369,444 B1 | | 4/2002 | Degani et al. |
| 6,400,035 B1 | * | 6/2002 | Hirata et al. ............ 257/778 |
| 6,477,046 B1 | | 11/2002 | Stearns et al. |
| 6,489,686 B2 | | 12/2002 | Farooq et al. |
| 6,492,726 B1 | | 12/2002 | Quek et al. |
| 6,501,164 B1 | | 12/2002 | Chen et al. |
| 6,507,107 B2 | * | 1/2003 | Vaiyapuri ............... 257/723 |
| 2002/0068425 A1 | | 6/2002 | Chen et al. |
| 2002/0109226 A1 | | 8/2002 | Khan et al. |
| 2002/0158319 A1 | | 10/2002 | Shibata |
| 2003/0034557 A1 | | 2/2003 | Gupta et al. |

FOREIGN PATENT DOCUMENTS

| | | |
|---|---|---|
| EP | 0 959 500 A2 | 11/1999 |
| EP | 1 189 280 A1 | 3/2002 |
| JP | 05129516 A * | 5/1993 |

* cited by examiner

*Primary Examiner*—Alonzo Chambliss
(74) *Attorney, Agent, or Firm*—Slater & Matsil, L.L.P.

(57) ABSTRACT

An integrated circuit package is proposed in which a laminar substrate 41 is provided with an aperture 43. A heat-spreader member 1 is mounted to cover this aperture 43, and contains a cavity 3 opening towards the aperture 43 in the substrate 41. A stack of integrated circuit circuits 11, 21, are located with one integrated circuit 21 of the stack inserted into the cavity 3, and one integrated circuit 11 of the stack electrically connected to the substrate 41.

20 Claims, 2 Drawing Sheets

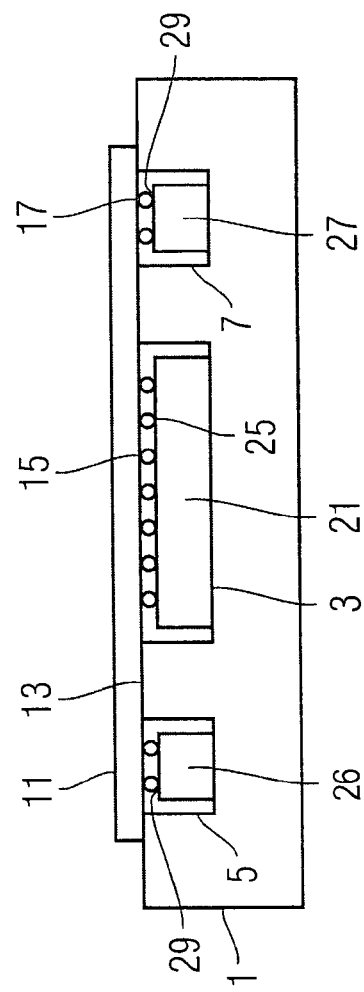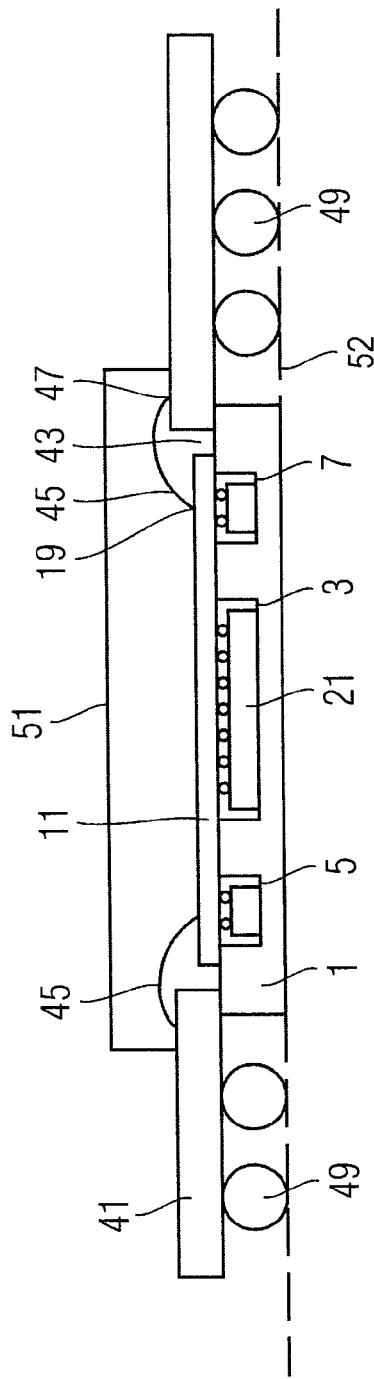

INTEGRATED CIRCUIT PACKAGE EMPLOYING A HEAT-SPREADER MEMBER

This application is a continuation of co-pending International Application No. PCT/SG2003/000126, filed May 28, 2003, which designated the United States and was published in English, and which application is incorporated herein by reference.

TECHNICAL FIELD

The present invention relates to methods of packaging integrated circuits using a heat-spreader member, and to integrated circuit packages produced using the method.

BACKGROUND

It is well known to provide integrated circuit packages in which integrated circuits (dies), principally composed of semiconductor material, are located within resin bodies. Electrical contacts of each integrated circuit are electrically in contact with corresponding electrical conductors, which protrude out of the resin body.

In one type of package, the integrated circuits are located on a die pad portion of a lead frame with the electric contacts facing away from the lead frame, and wires are formed between the electric contacts and respective lead fingers of the lead frame. The resin is applied to encase the integrated circuits and the wires in the resin body, leaving a portion of the lead frames protruding from the resin body. The lead fingers are then cut to separate them from the remainder of the lead frame, and thus singulate the packages.

An alternative type of integrated circuit is called a "flip chip," which is positioned on (and normally adhered to) a substrate with the electrical contacts facing the substrate, and in electrical contact with corresponding electric contacts provided in the substrate. The electric contacts on the substrate are typically electrically connected to electrically conductive paths formed through the material of the substrate. The flip-chip is typically encased in a resin body, which secures it to the substrate to form a package.

There is pressure to improve integrated circuit packages to increase the number of input/output connections (I/Os), reduce the package footprint, reduce the package thickness and improve the thermal management (that is, reduce the risk of the integrated circuit overheating).

Various proposals have been made to do this, typically proposing that a plurality of dies are packaged into a single package. For example, it is known to provide a plurality of dies inside a single package stacked one above the other with an adhesive paste between them. It is further known to provide two dies placed side-by-side (e.g., on a lead frame) within a single resin body.

One disadvantage with providing a stacked die package assembly is that the thickness of the package is increased. Additionally, there are reliability concerns due to the reduced possibilities for heat dissipation, which in turn lead to an increased risk of overheating.

Conversely, providing the dies side-by-side means that the footprint of the package is increased.

SUMMARY OF THE INVENTION

In various aspects, the present invention aims to provide new and useful methods of packaging integrated circuits, and new and useful integrated circuit packages.

In general terms, a first embodiment of the present invention provides a package in which a laminar substrate is provided with an aperture. A heat-spreader member is mounted to cover this aperture and contains a cavity opening towards the aperture. A stack of integrated circuits is located with at least one integrated circuit of the stack at least partially inserted into the cavity, and at least one integrated circuit of the stack electrically connected to the substrate.

Thus, the invention makes it possible to provide an integrated circuit package including a substrate and a plurality of stacked integrated circuits. Since the stacked integrated circuits project through the aperture in the substrate, the thickness of the package in the region of the integrated circuits does not depend upon the thickness of the substrate. Thus, the advantages of a stacked package (reduced integrated circuit footprint compared to a side-by-side arrangement) can be achieved with a reduced penalty in terms of the thickness of the package.

Furthermore, the heat-spreader member may be in intimate contact with at least one integrated circuit of the stack, and thus is highly effective in dissipating heat generated within the stack.

Preferably, at least one integrated circuit of the stack is completely located within the cavity in the heat-spreader member.

In a second embodiment, the invention provides in general terms a method of packing integrated circuits in which a stack of integrated circuits is formed, and at least one of the integrated circuits is at least partially inserted into a head-speader element. The heat-spreader member is mounted on a laminar substrate having an aperture, with the stack of integrated circuits threading the aperture.

Preferably, the stack of integrated circuits is formed as a composite element before the first integrated circuit is inserted into the aperture. However, it would alternatively be possible to insert one integrated circuit into the cavity, and then attach (e.g., adhere) the rest of the stack to it.

The stack of integrated circuits may include at least one integrated circuit having electric contacts wire bonded to the substrate, and at least one flip-chip having an array of electric contacts on a surface facing the first integrated circuit and in register with corresponding electric contacts on the integrated circuit. The flip-chip may be the integrated circuit that is inserted into the cavity in the heat-spreader member.

The heat-spreader member may optionally also contain further components, such as passive components. These may be in separate cavities in the heat-spreader member (or alternatively, the cavity in the heat-spreader member mentioned above may optionally be large enough to hold both the further components and the integrated circuit). The further components may be present in the heat-spreader member at the time that the first integrated circuit is inserted into the cavity. By this insertion operation, electric contacts of the further components come into register with, and electrical contact with, at least one of the stack of integrated circuits.

The substrate may be formed with electrical connection means (such as solder balls) on the same surface as the heat-spreader member. In this case, the heat-spreader member is preferably dimensioned to have substantially the same thickness as the electrical connection means, so that the heat-spreader member and solder balls can together lie on a flat surface.

The heat-spreader member may optionally be attached (e.g., adhered) to this flat surface, so improve the heat conduction to it. The surface may, for example, be a motherboard.

Since the integrated circuits are mounted in the aperture in the substrate, the thickness of the package in the region of the integrated circuits does not depend upon the thickness of the flexible substrate. Thus, the advantages of a stacked package (reduced integrated circuit footprint compared to a side-by-side arrangement) can be achieved with a reduced penalty in terms of the thickness of the package.

DESCRIPTION OF THE DRAWINGS

Embodiments of the invention will now be described for the sake of example only with reference to the following figures in which:

FIG. 3 is a view of a stack of integrated circuits partially inserted into the heat-member spreader member of FIG. 1; and FIG. 4 is a cross-sectional view of a package, which is an embodiment of the invention.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
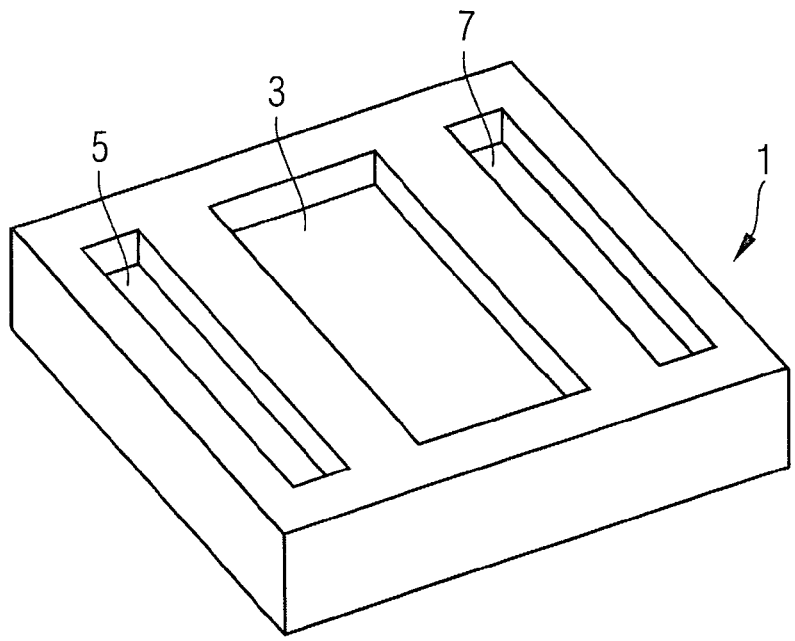
FIG. 1 is a view of a heat-spreader member for use in a method, which is an embodiment of the invention.

Referring firstly to FIG. 1, a heat-spreader member 1 is shown in a perspective view. The member is generally cuboidal, having two major surfaces of which one is shown directed upwardly. This major surface includes three cavities 3, 5, 7, which may be of the same depth or of different depths. The material of the heat-spreader member 1 may be made of a thermally conductive material, such as aluminum or copper.

Figure 2:
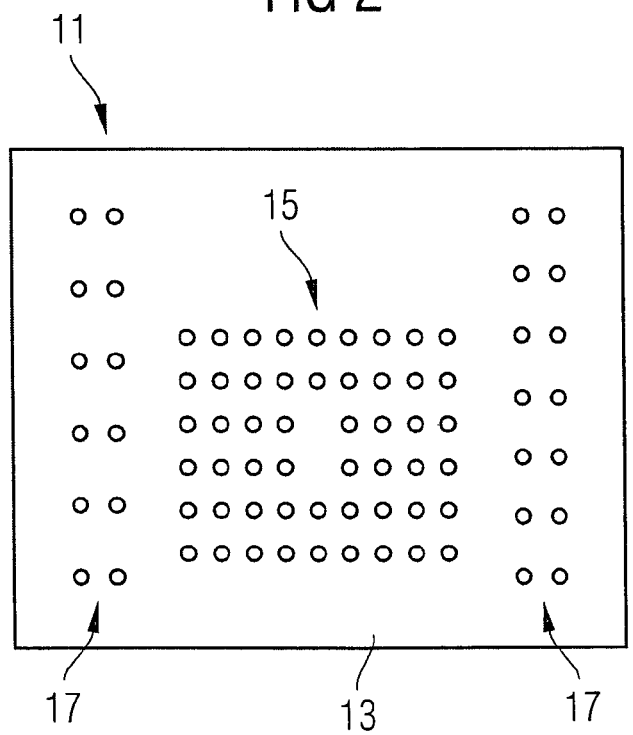
FIG. 2 is a view of an integrated circuit for use in the embodiment.

Turning to FIG. 2, a first integrated circuit 11 is shown looking toward one of its major surfaces 13. The surface 13 includes first electrical contacts 15, and second electrical contacts 17. The other major surface (not shown in FIG. 2) of the integrated circuit 11 includes further electrical contacts 19.

In a first step of the method, a second integrated circuit 21 (see FIG. 3) is attached to the central portion of the major surface 13 of the integrated circuit 11. The second integrated circuit 21 may be a conventional flip-chip. It has electrical contacts 25 in an array. The electrical contacts 25 are in register with, and in electrical contact with, respective ones of the electrical contacts 15 when the first and second integrated circuits 11, 21 are attached. The attachment of the first and second integrated circuits 11, 21 may be according to any known flip-chip technique, such as one employing an ACP (anisotropic conductive paste) or ACF (anisotropic conductive film). Thus, the first and second integrated circuits 11, 21 are formed into a composite element.

Electric components 26, 27 are then inserted into the cavities 5, 3 with their electrical contacts 29 directed upwards. These components 26, 27 may be passive components, such as capacitors or resistors.

The second integrated circuit 21 is also inserted into the cavity 3 of the heat-spreader member 1, so that the first integrated circuit 11 covers a portion of the upper surface of the heat-spreader member 1. The electrical contacts 17 of the first integrated circuit 11 come into register and electrical contact with the electrical contacts 29 of the electric components 26, 27. The result is shown in FIG. 3.

The stack of integrated circuits 11, 21 and/or the passive components 26, 27 may be adhered to the heat-spreader member 1. For example, this can be done by providing an adhesive in any one or more of the cavities 3, 5, 7 before the integrated circuits 11, 21 and/or the passive components 26, 27 are inserted into them. Alternatively, the adhesive may be injected into the cavities after the insertion of the integrated circuits 11, 21 and/or the passive components 26, 27. In either case, the adhesive is preferably not electrically conductive, though preferably having high heat conductivity.

In a next step of the method the heat-spreader member 1 is adhered to one surface of a laminar substrate 41 (see FIG. 4) having electrical circuitry (e.g., conductive lines) provided in and/or on it. The substrate 41 contains an aperture 43 through which the first integrated circuit 11 projects. The substrate 41 may be composed of a laminate such as BT (Bismaleimide Triazine), FR4 (a common term for an epoxy/fibreglass material) or a flex substrate material, such as a polyimide.

Wire bonds 45 (e.g., of gold) are formed between the electrical contacts 19 of the first integrated circuit 11 and respective electrical contacts 47 of the substrate 41.

Then a resin body 51 is molded around the wire bonds 45, by putting the combination of the substrate 41 and heat-spreader member 1 into an appropriately shaped mold, allowing liquid resin to fill the mold, and curing the resin. The result is shown in FIG. 4.

The lower surface (as seen in FIG. 4) of the substrate 41 is provided with eutectic solder balls 49. The solder balls preferably have a diameter substantially equal to the thickness of the heat-spreader member 1, so that when the balls 49 are laid onto a substantially flat surface (shown dashed as 52 in FIG. 4) and electrically coupled thereto, the surface of the heat-spreader member 1 opposite the substrate 41 lies substantially flat against the flat surface 52.

The heat-spreader member 1 may in fact be adhered to the flat surface 52, to fix the package firmly in a desired location, and/or to improve heat conduction between them. The flat surface may for example be a motherboard. The solder balls 49 too are connected to the heat-spreader member 1 through the substrate 41, enabling high heat dissipation of heat generated in the integrated circuits 11, 21.

In another embodiment, the heat-spreader member 1 may be thinner than the solder balls 49 and thermally communicate with the flat surface 52 via a material (not shown) provided on the flat surface 52. Alternatively, an air gap can be provided between the heat-spreader member 1 and the flat surface 52.

The embodiment provides a package for multiple integrated circuits (indeed more than two integrated circuits may be provided, e.g., with one or more additional integrated circuits mounted by conventional stacking techniques on the surface of the first integrated circuit 11, which faces upwards in FIG. 4). This is achieved with a small package footprint (due to the stacking), yet with a low package thickness, and with low substrate cost. Additionally, the discrete passive components improve the performance of the package, in particular its reliability and functionality.

What is claimed is:

1. An integrated circuit package comprising:
   a substrate having an aperture;
   a heat-spreader member attached to a surface of the substrate and extending over at least part of the aperture, the heat-spreader member containing a cavity, the cavity having an opening facing towards the aperture; and
   a stack of two or more integrated circuits directly flip-chip bonded to each other with a first integrated circuit of the stack covering at least a portion of an upper surface of the heat-spreader member and at least a second integrated circuit of the stack at least partially inserted into the cavity through the opening, the first integrated circuit of the stack being electrically connected to the substrate by wire bonding.

2. The package according to claim 1 wherein the second integrated circuit of the stack is completely located within the cavity in the heat-spreader member.

3. The package according to claim 1 wherein the first integrated circuit of the stack has electric contacts wire bonded to the substrate, and the second integrated circuit of the stack has an array of electric contacts on a surface facing the first integrated circuit and in register with corresponding electric contacts on the first integrated circuit.

4. The package according to claim 1 wherein the heat-spreader member contains further electronic components.

5. The package according to claim 4 wherein the further components comprise passive components.

6. The package according to claim 4 wherein the further components are located in one or more further cavities in the heat-spreader member.

7. The package according to claim 1 further comprising an electrical connection on the surface of the substrate adjacent the heat-spreader member, a surface of the heat-spreader member away from the substrate being co-planar with surfaces of the electrical connection away from the substrate.

8. The package according to claim 7, wherein the electrical connection comprises solder balls.

9. The package according to claim 8, wherein the solder balls have a height substantially equal to a height of the heat-spreader member.

10. The package according to claim 1 in which the surface of the heat spreader member away from the substrate is attached to a motherboard.

11. An integrated circuit package comprising:
    a substrate having an aperture;
    a heat-spreader member attached to a bottom surface of the substrate and including a cavity in at least partial alignment with the aperture, the cavity having an opening facing towards the aperture; and
    a stack of two or more integrated circuit circuits electrically connected to the substrate directly flip-chip bonded to each other with a first integrated circuit of the stack covering at least a portion of an upper surface of the heat-spreader member and at least a second of the integrated circuits at least partially disposed within the cavity the first integrated circuit of the stack being electrically connected to the substrate by wire bonding,
    an electrical connection disposed on the bottom surface of the substrate, and
    a circuit board having electrical contacts electrically connected to the electrical connection of the substrate, a surface of the heat-spreader member being thermally coupled to the circuit board.

12. An integrated circuit package comprising:
    a substrate having an aperture;
    a heat-spreader member attached to a surface of the substrate and extending over at least part of the aperture, the heat-spreader member containing a cavity opening towards the aperture; and
    a stack of two or more integrated circuits adjacent the heat-spreader member wherein a first one of said integrated circuits includes electric contacts electrically connected to the substrate by wire bonding and covering at least a portion of an upper surface of the heat-spreader member, and at least one second integrated circuit of the stack has an array of electrical contacts on a surface facing the first integrated circuit and in register with corresponding electrical contacts on the first integrated circuit and is at least partially inserted into the cavity from the direction of the aperture.

13. The package according to claim 12 wherein said at least one second integrated circuit is completely located within the cavity of the heat-spreading member.

14. The package of claim 12 wherein further components are electrically connected to said first integrated circuit.

15. An integrated circuit package including:
    a substrate having an aperture;
    a heat-spreader member attached to a surface of the substrate and extending over at least part of the aperture, the heat-spreader member containing a plurality of cavities opening towards the aperture; and
    a stack of two or more integrated circuits adjacent the heat-spreader member, wherein at least one integrated circuit of the stack is at least partially inserted into one of the plurality of cavities from the direction of the aperture, and at least one integrated circuit of the stack is electrically connected to the substrate by wire bonding and covering at least a portion of an upper surface of the heat-spreader member.

16. The package according to claim 15, wherein the at least one integrated circuit of the stack is completely located within one of the plurality of cavities in the heat-spreader member.

17. The package according to claim 15, wherein a first integrated circuit of the stack has electric contacts wire bonded to the substrate, and at least one second integrated circuit of the stack has an array of electric contacts on a surface facing the first integrated circuit and in register with corresponding electric contacts on the first integrated circuit.

18. The package according to claim 17, wherein the second integrated circuit is at least partially inserted into one of the plurality of cavities.

19. The package according to claim 15, wherein the heat-spreader member contains further electronic components are electrically connected to said integrated circuit electrically connected to the substrate.

20. The package according to claim 19, wherein the further components are located in one or more of said plurality of cavities in the heat-spreader member.

* * * * *